(12) United States Patent
Adams et al.

(10) Patent No.: US 8,233,342 B2
(45) Date of Patent: Jul. 31, 2012

(54) APPARATUS AND METHOD FOR IMPLEMENTING WRITE ASSIST FOR STATIC RANDOM ACCESS MEMORY ARRAYS

(75) Inventors: Chad A. Adams, Byron, MN (US); George M. Braceras, Essex Junction, VT (US); Harold Pilo, Underhill, VT (US); Fred J. Towler, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1174 days.

(21) Appl. No.: 12/048,237

(22) Filed: Mar. 14, 2008

(65) Prior Publication Data
US 2009/0235171 A1  Sep. 17, 2009

(51) Int. Cl.
*G11C 7/00* (2006.01)
(52) U.S. Cl. .............. 365/203; 365/189.16; 365/194; 365/204
(58) Field of Classification Search .......... 365/203, 365/189.16, 194, 204
See application file for complete search history.

(56) References Cited

U.S. PATENT DOCUMENTS

| | | | | |
|---|---|---|---|---|
| 5,576,641 A * | 11/1996 | Yoneya et al. | ................. | 326/83 |
| 6,084,454 A * | 7/2000 | Holst | ........................... | 327/198 |
| 6,671,201 B2 | 12/2003 | Masuda | | |
| 7,292,481 B2 * | 11/2007 | Takeda | ..................... | 365/189.05 |
| 7,499,325 B2 * | 3/2009 | Doyle et al. | ............. | 365/185.14 |
| 2007/0081379 A1 | 4/2007 | Clinton et al. | | |

* cited by examiner

*Primary Examiner* — Son Dinh
(74) *Attorney, Agent, or Firm* — Cantor Colburn LLP; Michael LeStrange

(57) ABSTRACT

An apparatus for implementing a write assist for a memory array includes a common discharge node configured to provide a discharge path for precharged write data lines and bit lines selected during a write operation of the memory array; negative boost circuitry configured to introduce a voltage lower than a nominal logic low supply voltage onto the common discharge node following the discharge of the common discharge node, write data lines and bit lines; and a clamping device coupled to the common discharge node, the clamping device configured to limit the magnitude of negative voltage applied to common discharge node by the negative boost circuitry so as to prevent activation of non-selected bit switches.

20 Claims, 4 Drawing Sheets

APPARATUS AND METHOD FOR IMPLEMENTING WRITE ASSIST FOR STATIC RANDOM ACCESS MEMORY ARRAYS

BACKGROUND

The present invention relates generally to integrated circuit (IC) memory devices and, more particularly, to an apparatus and method for implementing write assist for static random access memory (SRAM) arrays.

Memory devices are commonly employed as internal storage areas in a computer or other type of electronic equipment. One specific type of memory used to store data in a computer is random access memory (RAM), such as static RAM (SRAM) or dynamic RAM (DRAM), for example. RAM is typically used as main memory in a computer environment. RAM is generally volatile, in that once power is turned off, all data stored in the RAM is lost.

A typical SRAM device includes an array of individual SRAM cells. Each SRAM cell is capable of storing a binary voltage value therein, which voltage value represents a logical data bit (e.g., "0" or "1"). One existing configuration for an SRAM cell includes a pair of cross-coupled devices such as inverters. With CMOS (complementary metal oxide semiconductor) technology, the inverters further include a pull-up PFET (p-channel) transistor connected to a complementary pull-down NFET (n-channel) transistor. The inverters, connected in a cross-coupled configuration, act as a latch that stores the data bit therein so long as power is supplied to the memory array. In a conventional six-transistor (6T) cell, a pair of access transistors or pass gates (when activated by a word line) selectively couples the inverters to a pair of complementary bit lines. Other SRAM cell designs may include a different number of transistors, e.g., 4T, 8T, etc.

The design of SRAM cells has traditionally involved a compromise between the read and write functions of the memory cell to maintain cell stability, read performance and write performance. The transistors which make up the cross-coupled latch must be weak enough to be overdriven during a write operation, while also strong enough to maintain their data value when driving a bit line during a read operation. The access transistors that connect the cross-coupled cell nodes to the true and complement bit lines affect both the stability and performance of the cell. In one-port SRAM cells, a single pair of access transistors is conventionally used for both read and write access to the cell. The gates are driven to a digital value in order to switch the transistors between an on and off state. The optimization of an access for a write operation would drive the reduction of the on-resistance ($R_{on}$) for the device. On the other hand, the optimization of an access transistor for a read operation drives an increase in $R_{on}$ in order to isolate the cell from the bit line capacitance and prevent a cell disturb.

One recently proposed approach to improving write performance of SRAM devices is to use so-called "negative boosting" to discharge a bit line to a voltage level below the nominal low supply rail value (e.g., ground). In so doing, the pass gates of the SRAM cell coupled to the discharged bit line see a resultant increase in both the gate-to-source and drain-to-source voltages. This negative boosting may allow for an increased margin of $3\sigma$ or more (in terms of expected device failures) as compared to more conventional write techniques, wherein the bit line is simply discharged to the value of the nominal low voltage rail (e.g., ground).

However, notwithstanding the benefits of negative boosting, there are additional problems associated with this technique as presently implemented. For example, in array columns that are unselected (e.g., bit switches are non-conductive to nominally prevent discharging of the associated bit lines), the discharge of a bit line could inadvertently render an inactive bit switch connected thereto conductive if the difference between the gate voltage (e.g., ground) and the source terminal (boosted to a negative voltage) exceeds the threshold voltage of the transistor. In addition, conventional write drivers may allow charge transfer from write data lines to a boost node in unselected memory banks. Furthermore, in existing negative boosting write assist devices, power is wasted when charging a boost capacitor used to generate the voltage below the value of the logic low supply rail. Still another shortcoming of write assist circuitry is the timing between the discharge of the bit line to ground and the subsequent of the negative boost assist to the bit line. If the boost is performed too soon before complete discharge, the bit line will not reach the optimum voltage level below ground potential. Conversely, if performed too late following bit line discharge, the array incurs a cycle-time penalty.

Accordingly, it would be desirable to be able to take advantage of the performance benefits of negative boost write assistance, but in a manner that also overcomes the above described disadvantages currently associated therewith.

SUMMARY

The foregoing discussed drawbacks and deficiencies of the prior art are overcome or alleviated, in an exemplary embodiment, by an apparatus for implementing a write assist for a memory array, including a common discharge node configured to provide a discharge path for precharged write data lines and bit lines selected during a write operation of the memory array; negative boost circuitry configured to introduce a voltage lower than a nominal logic low supply voltage onto the common discharge node following the discharge of the common discharge node, write data lines and bit lines; and a clamping device coupled to the common discharge node, the clamping device configured to limit the magnitude of negative voltage applied to common discharge node by the negative boost circuitry so as to prevent activation of non-selected bit switches.

In another embodiment, an interlock apparatus for controlling timing of write assist circuitry associated with a memory array includes a mimic bit line configured to have substantially the same discharge characteristics as write data lines and bit lines associated with the memory array; trip voltage logic coupled to the mimic bit line, the trip voltage logic configured to generate a trip signal upon detection of the mimic bit line being discharged to ground potential; and the trip signal controlling a logic state of a feedback node common to discharge devices of the mimic bit line, and of the write data lines and the bit lines of the memory array such that deactivation of the discharge of the selected write data lines and bit lines of the memory array during a write operation and application of a negative boost voltage to the selected write data lines and bit lines of the memory array does not occur until after the bit lines and write data lines are discharged to ground.

In still another embodiment, a method for implementing a write assist for a memory array includes configuring a common discharge node to provide a discharge path for precharged write data lines and bit lines selected during a write operation of the memory array; configuring negative boost circuitry to introduce a voltage lower than a nominal logic low supply voltage onto the common discharge node following the discharge of the common discharge node, write data lines and bit lines; and coupling a clamping device to the common discharge node, the clamping device configured to limit the magnitude of negative voltage applied to common discharge node by the negative boost circuitry so as to prevent activation of non-selected bit switches.

BRIEF DESCRIPTION OF THE DRAWINGS

Referring to the exemplary drawings wherein like elements are numbered alike in the several Figures.

DETAILED DESCRIPTION

Disclosed herein is an apparatus and method for implementing write assist for SRAM arrays. In one aspect, a negatively boosted write assist apparatus is provided with both a clamping device and an isolation device coupled to a common bit line discharge node. The isolation device selectively couples the common bitline discharge node to a common boost node driven by a boost capacitor for generating the voltage below the low supply rail value, so as to prevent charge transfer from write data lines to the boost node in unselected banks. The clamping device prevents the negative boost voltage generated on the boost node from dropping the common discharge node below a certain value that could otherwise activate unselected bit switches.

In another aspect, a single control function ordinarily used to control both the discharge of the common discharge node and generation of the negative boost voltage on the boost node is made independent of one another such that the power dissipated in charging the boost capacitor is further advantageously used to precharge the write bit lines and write data lines, instead of otherwise being wasted.

In still another aspect, an interlock circuit is used to generate feedback that controls the timing of completion of the initial discharge of the common discharge node and the beginning of the negative boost sequence. In lieu of an open-ended timing sequence that could result in process variations causing premature boosting or delayed boosting, a mimic bit line associated with one or more dummy array cells located along the periphery of the array is used in conjunction with control interlock logic that determines a point at which the mimic bit line is very close to ground potential. Once this mimic bit line discharge point is detected, the interlock logic forces the write line discharge control circuitry to cease discharging the common discharge node to ground and apply the negative boost.

Figure 1:
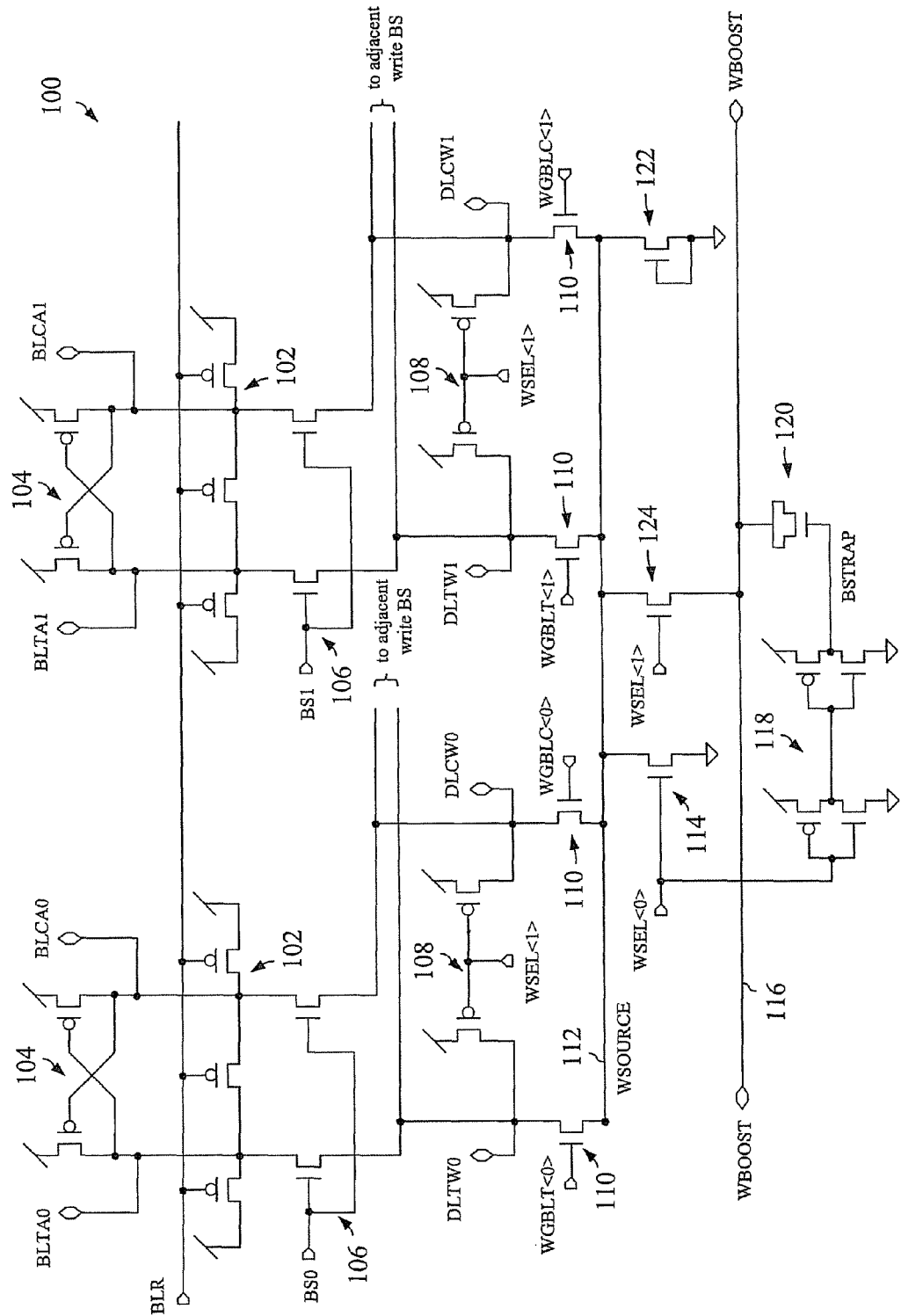
FIG. 1 is a schematic diagram of an apparatus for implementing write assist for SRAM arrays, in accordance with an embodiment of the invention.

Referring initially to FIG. 1, there is shown a schematic diagram of an apparatus 100 for implementing write assist for SRAM arrays, in accordance with an embodiment of the invention. In the exemplary embodiment depicted, only two bit line pairs are illustrated for purposes of simplicity, and thus it will be understood that several additional bit line pairs are contemplated in a functional SRAM array. The bit line pairs (true and complement) shown in FIG. 1 are labeled as BLT_A0, BLC_A0 and BLT_A1, BLC_A1. Each bit line pair includes a trio of precharge PFETs (collectively designated by 102) that are controlled through control signal BLR, as well as a pair of cross-coupled PFETs (collectively designated by 104) that serve to reinforce the VDD-precharged level of only one of the bit line pair during a write operation.

As further shown in FIG. 1, each bit line pair includes a pair of bit switches 106, controlled by respective control signals BS0, BS1. The bit switches of a given bit line pair enable writing of individual SRAM cells connected to the bit line pair. The write data to be written to selected SRAM cells is introduced through complementary write data line pairs DLTW0, DLCW0 and DLTW1, DLCW1 in the exemplary embodiment depicted. The write data line pairs are also precharged to a logic high rail voltage ($V_{DD}$) through PFET devices collectively designated by 108, and the activation of which is controlled by signal WSEL<1>.

Global write data is sent to each of the bit line pairs through a pair of NFETs collectively designated by 110. For a given write data line pair (e.g., DLTW0, DLCW0) the corresponding global write data NFET control signals (e.g., WGBLT<0>, WGBLC<0>) determine which of the true and complementary bit lines of the column will be discharged during the write operation for that column. Thus, the source terminals of each of the global write data NFETs 110 are coupled to a common discharge node 112 labeled WSOURCE in FIG. 1. The common discharge node 112 (WSOURCE) is discharged to the nominal low voltage supply rail (e.g., ground) upon activation of a discharge NFET 114 through control signal WSEL<0>. In a conventional write circuit for an SRAM array, the writing of data would be accomplished once WSOURCE is discharged to ground through the discharge NFET device 114. However, as mentioned above, a negative boost is also used to provide a write assist feature in order to increase the write margin without incurring significant circuit complexity and area penalty.

More specifically, FIG. 1 further illustrates negative boost circuitry, including a negative boost node 116 (WBOOST), a delay stage (inverter pair) 118, and a boost capacitor 120. As known in the art, the boost capacitor may be embodied by, for example, a thick oxide FET such as a depletion mode NFET. One of the capacitor electrodes (e.g., the gate terminal of the FET) is coupled to the output of the delay stage 118, while the other capacitor electrode (e.g., the shorted source/drain terminals of the FET) is coupled to the negative boost node 116. In the embodiment depicted, the charging of the boost capacitor (delayed by inverter delay stage 118) follows and is controlled by the same signal WSEL<0> used to activate the discharge NFET device 114.

The mechanism of generating a negative voltage on the boost node 116 with respect to the common discharge node 112 is known in the art, and a detailed description of the same is omitted herein. Notwithstanding, it will be appreciated that the negative boost circuitry is designed to generate a negative voltage with respect to the low voltage rail (e.g., ground) to the extent of about, for example 150 millivolts (mV). Thereby, each decoded write data line applies a negative voltage on the bitline so as to increase both gate-to-source voltage ($V_{gs}$) and drain-to-source voltage ($V_{ds}$) on the cell pass gates (not shown), in turn increasing the pass gate conductivity cell write margin by 3σ or more.

However, as also indicated above, existing negative boost voltage generating devices do not necessarily prevent the boost node from dropping the common discharge node below a certain value that could otherwise activate unselected bit switches. That is, if the negative boost voltage is too large in magnitude, device performance could be adversely affected. Accordingly, FIG. 1 further provides a clamping device 112, embodied by a diode connected NFET. In so doing, the common discharge node 112 (WSOURCE) is prevented from dropping more than (for example) about 250 mV below ground potential, assuming the nominal logic low supply rail is ground. Thereby, the source terminals of unselected NFET bit switches are not at such a low voltage below ground as to render them conductive when the gate voltage is at a nominally deactivated ground potential.

In addition to providing voltage clamping of the common discharge node 112, the write assist apparatus 100 further provides an isolation device 124 to selectively isolate the common discharge node 112 from the negative boost node 116. The isolation device 124, embodied by an NFET controlled by signal WSEL<1> in FIG. 1, prevents charge transfer from write data lines to the negative boost node 116 in unselected banks. Moreover, there is also a resulting performance improvement by keeping the negative boost node voltage between ground and the negative voltage generated thereon. Further, the isolation device 124 helps to eliminate the variability of the boost level generated on the bit lines prior to the boosting operation.

In operation of apparatus 100, the bit line pairs and data line pairs are initially charged to the logic high supply value (e.g., $V_{DD}$). After the precharge is complete, the discharge NFET 114 is activated by signal WSEL<0> transitioning from low to high, thus discharging the common discharge node to ground. Depending upon the data on the global bit line signals, one of the true/complement data lines in a given column may be selectively activated through a corresponding NFET 110. In turn, all selected bit lines are provided with a path to ground. Notably, once the precharge of the data lines is completed (i.e., signal WSEL<1> transitions from low to high), the isolation device NFET 124 is activated to couple the common discharge node 112 to the negative boost node 116.

During the discharge of the global discharge node 112 to ground, the control signal WSEL<0> (through inverter delay stage 118) charges the boost capacitor 120 to $V_{DD}$. The resulting positive charge transferred from the boost capacitor 120 to the negative boost node 116 is also drained by the discharge NFET 114. Once the common discharge node is discharged to ground, NFET 114 is deactivated, which also results in the subsequent discharging of the gate terminal of the boost capacitor 120 (also labeled as node BSTRAP in FIG. 1), thereby allowing the voltage of the common discharge node 112 to move below ground, the magnitude of which is limited by the clamping device 122. Any excess negative charge on the common discharge node is dissipated by the diode-connected NFET 122.

Figure 2:
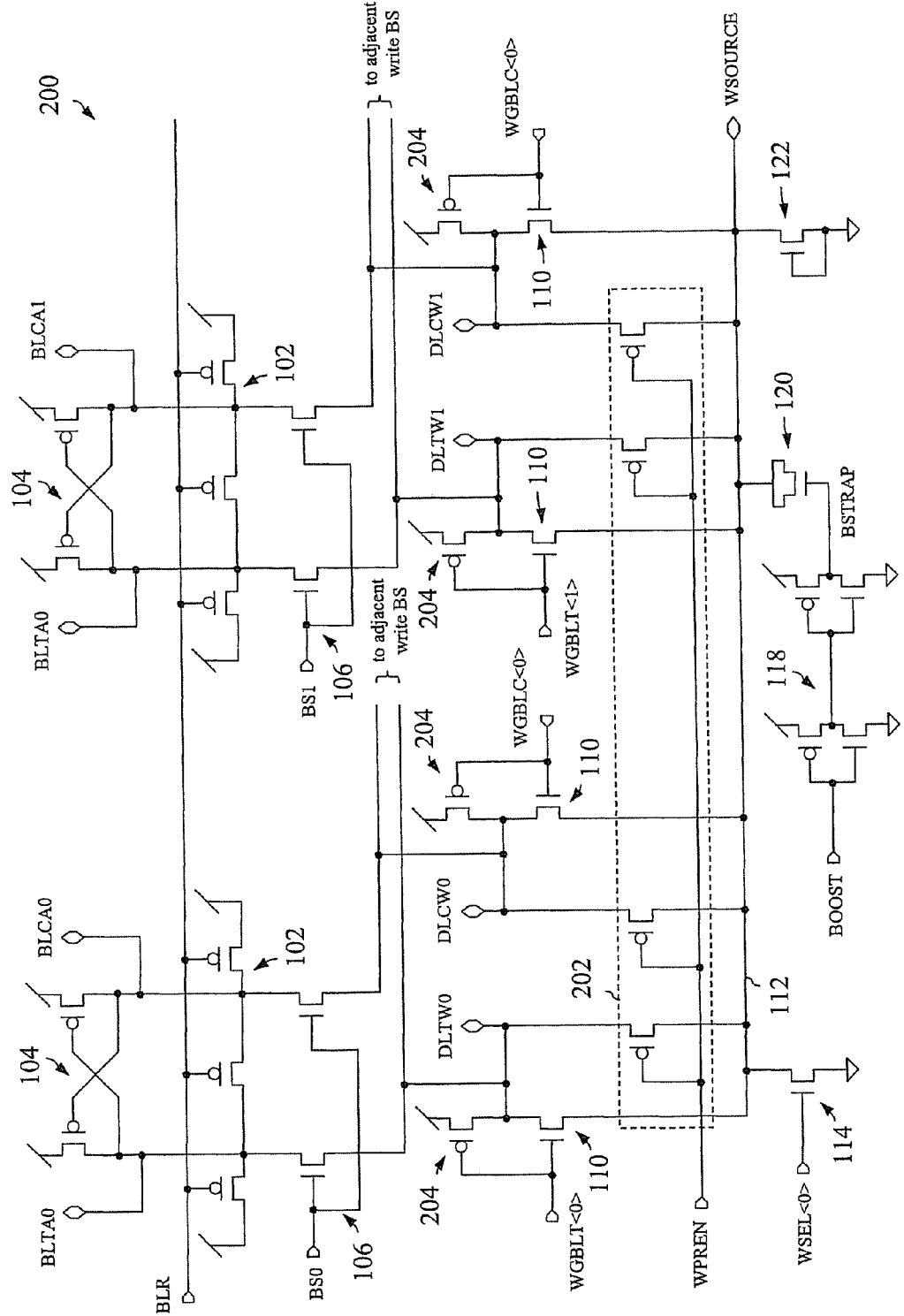
FIG. 2 is a schematic diagram of an apparatus for implementing write assist for SRAM arrays, in accordance with an alternative embodiment of the invention.

Referring initially to FIG. 2, there is shown a schematic diagram of an apparatus 200 for implementing write assist for SRAM arrays, in accordance with an alternative embodiment of the invention. With respect to the embodiment of FIG. 1, like elements in apparatus 200 are designated with the same reference numbers for ease of understanding. The apparatus 200 may be utilized, for example, in applications where power dissipation is a primary concern. Specifically, in generating the negative boost voltage described above, the capacitor charge is essentially wasted. However, in the embodiment of FIG. 2, the energy used in charging the boost capacitor is further reused to assist in precharging the write data lines and bit lines.

More specifically, it will be noted in FIG. 2 that both the discharge NFET 114 and the boost capacitor 120 are coupled directly to the common discharge node 112 (WSOURCE), and thus the use of a separate negative boost node is eliminated. Because the generation of the boost voltage is now used in precharging write data and bit lines, the control of the discharge NFET 114 is now decoupled from the charging of the boost capacitor 120. That is, the discharge NFET 114 is still controlled by signal WSEL<0>, but charging of the boost capacitor 120 is now controlled by a separate control signal (BOOST) coupled to the input of the inverter delay stage 118.

As further illustrated in FIG. 2, precharging of the data lines and bit lines is implemented through set of PFET precharge devices, collectively designated by 202. The source terminals of the precharge devices 202 are coupled to respective the data lines and bit lines, while the drain terminal thereof are coupled to the common discharge node 112. Control of the PFET precharge devices 202 is implemented through a precharge signal WPREN applied to the gate terminals thereof. In addition, the global write data signals are (in addition to being applied to global write data NFETs 110) applied to another set of PFETs 204 to help maintain the charge on unselected write data lines and bit lines. Although the apparatus 200 of FIG. 2 offers improved power dissipation with respect to the embodiment of FIG. 1, one trade off resulting from the use of the boost capacitor charge for precharging is the use of an additional control signal, which results in more complex device control, and ultimately increased cycle time.

With respect to timing, there is also the issue of precisely controlling the timing of turning off the WSEL<0> signal so that the negative boost generated on the common discharge node 112 occurs shortly after the bit lines are actually discharge to ground through NFET 114. As indicated above, if the boost is performed too soon before complete discharge of the bit line, the boost circuitry will actually increase the voltage on the discharging bit line instead of lowering it below ground potential (thus preventing the desired write operation). Conversely, if the boost is performed too late following bit line discharge, the array incurs a time penalty.

Figure 3:
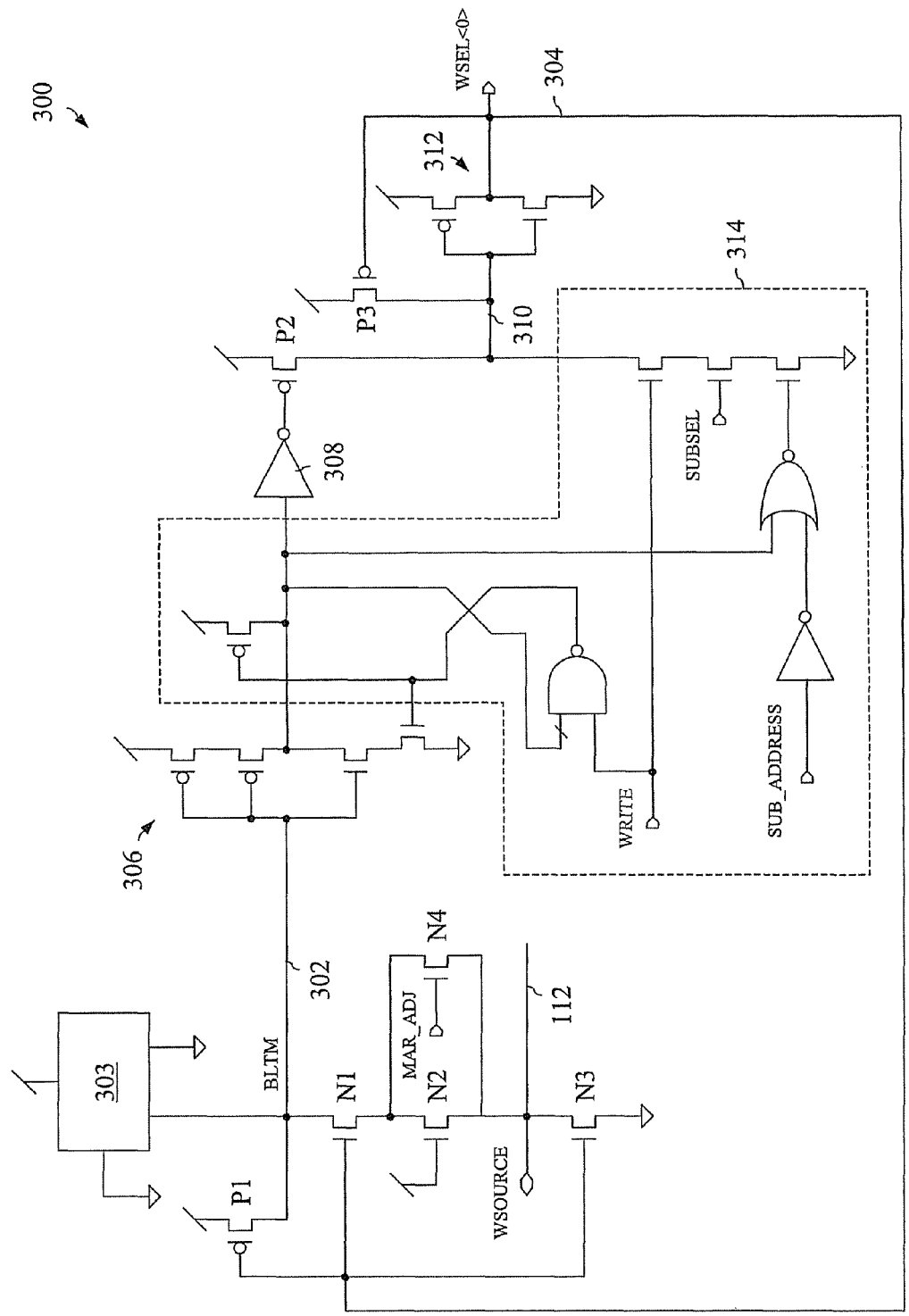
FIG. 3 is a schematic diagram of a feedback interlock circuit used to control the timing of the application of negative boost sequence for the write assist circuitry, in accordance with a further embodiment of the invention.

Accordingly, FIG. 3 is a schematic diagram of a feedback interlock circuit 300 used to control the timing of the application of negative boost sequence for the write assist circuitry, in accordance with a further embodiment of the invention. In sum, the interlock circuit 300 provides a more precise timing of the turn-off of signal WSEL<0> so that the boost on the write data lines and occurs shortly after the bit lines are discharged to ground by NFET 114. More specifically, the interlock circuit 300 includes a mimic bit line 302 (BLTM) that has write discharge characteristics substantially equivalent to that of a functional bit line (e.g., BLTA0). Dummy array edge cells, such as dummy cell 303 for example, are used to provide the mimic bit line 302. Because such dummy edge cells are already used in traditional memory devices to isolate and protect the functional array cells from lithographic aberrations, no area penalty is incurred from the use of the mimic bit line.

As further shown in FIG. 3, the mimic bit line 302 is connected to series NFETs N1, N2 and N3 that emulate the discharge of a functional bit line during a write cycle. NFETs N1 and N3 are controlled by a feedback node 304 in common with the control signal WSEL<0>. A precharge PFET P1 is also controlled by the feedback node 304 to precharge the mimic bit line 302. NFET N3 is also coupled to the common discharge node 112. Another NFET N4, in parallel with N2, is a margin adjust device controlled by a signal (MAR_ADJ) so as to tune the discharge characteristics of the mimic bit line 302 if need be. Thus, during the discharge of the common discharge node such as in FIGS. 1 and 2, the mimic bit line 302 is also discharged in a similar manner.

The voltage on the mimic bit line 302 is input to trip voltage logic depicted generally at 306 in FIG. 3. The trip voltage logic 306 (e.g., a NAND gate) is configured to trip and generate a logic high output once the voltage on the mimic bit line is close to ground potential. This trip signal is inverted by inverter 308 and coupled to PFET P2, which in turn causes circuit node 310 to be pulled high. Another inverter 312 (along with keeper PFET P3) then converts the logic high voltage on node 310 to a logic low voltage at the output thereof, which is also coupled to the feedback node 304. As a result, WSEL<0> transitions from high to low, thereby ceasing the discharge of not only the array bit lines and write data lines, but also the mimic bit line 302. In so doing, the low transition of WSEL<0> that turns off the discharge of the common discharge node does not occur until the bit lines are discharged to ground.

FIG. 3 also illustrates the interface between the interlock circuitry of the mimic bit line and the control circuitry used to implement the write operations of the array, the control circuitry generally designate by 314. As shown, the control circuitry includes a write command signal (WRITE), a sub-array select signal (SUBSEL) and address decode signal (SUB_ADDRESS).

Figure 4:
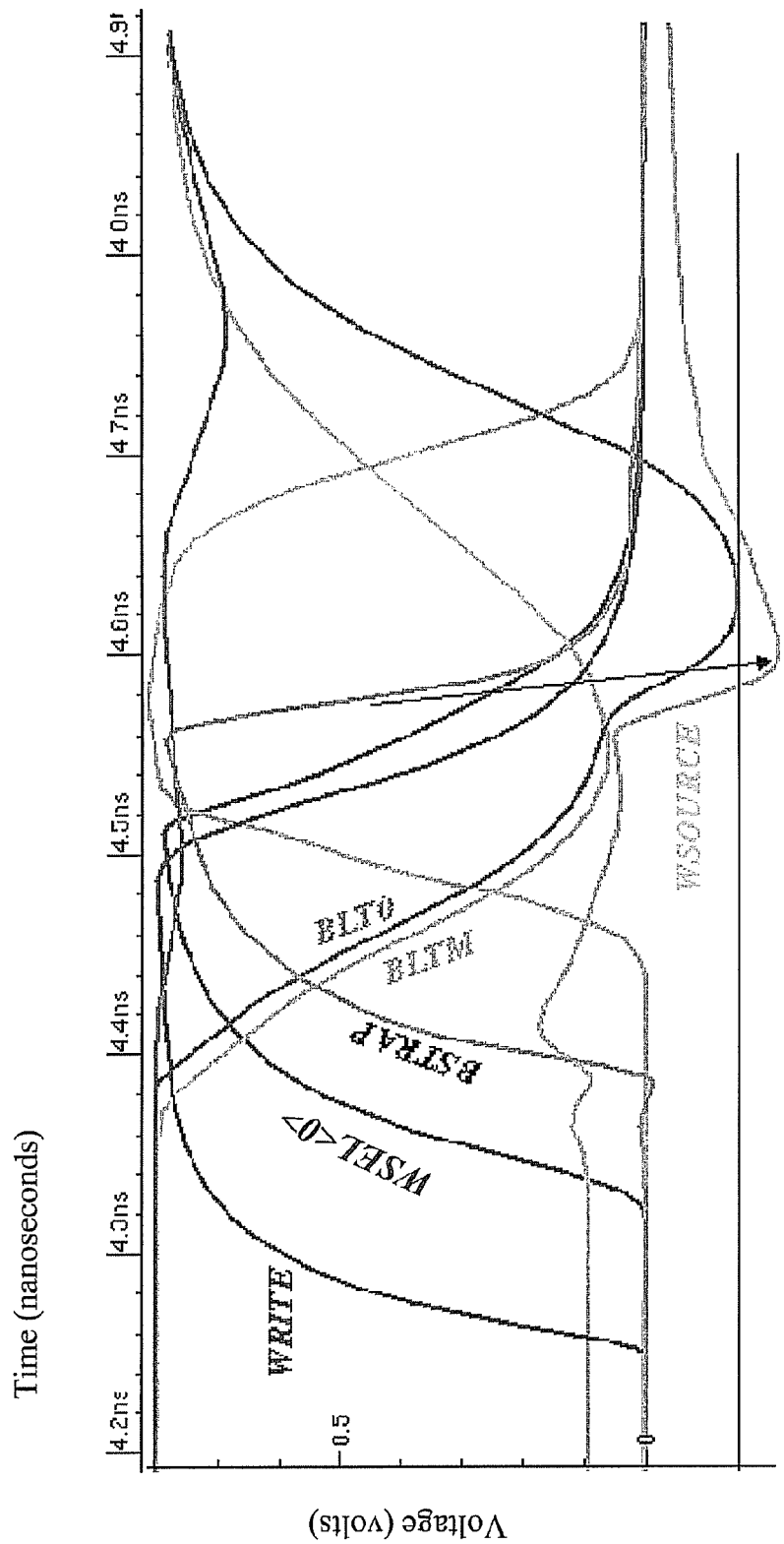
FIG. 4 is a graph illustrating the operation of the feedback interlock circuit of FIG. 3.

Finally, FIG. 4 is a graph illustrating the operation of the feedback interlock circuit of FIG. 3. In particular, FIG. 4 illustrates the timings of the interlock circuit 300. The WRITE command enables the activation of the WSEL<0> signal that in turn initiates the discharge of the mimic bit line (BLTM). It will be noted from FIG. 4 that the discharging transition of the mimic bit line BLTM is very close (in both slew rate and timing) to that of a functional bit line (BLT0). Upon reaching the low-level trip point of the mimic bit line (at about 4.55 ns in FIG. 4), the interlock circuitry shuts off the discharge of all bit lines (i.e., the mimic bit line BLTM and all functional bit lines). Shortly thereafter, node BSTRAP (representing the gate voltage of the boost capacitor from FIGS. 1 and 2) transitions low to negatively boost WSOURCE as indicated by the arrow in FIG. 4 and produce a negative voltage on the functional bit line BLT0.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for implementing a write assist for a memory array, comprising:
 a common discharge node configured to provide a discharge path for precharged write data lines and bit lines selected during a write operation of the memory array;
 negative boost circuitry configured to introduce a voltage lower than a nominal logic low supply voltage onto the common discharge node following the discharge of the common discharge node, write data lines and bit lines; and
 a clamping device coupled to the common discharge node, the clamping device configured to limit the magnitude of negative voltage applied to common discharge node by the negative boost circuitry so as to prevent activation of non-selected bit switches.

2. The apparatus of claim 1, wherein the nominal logic low supply value is ground and the negative boost circuitry configured to introduce a negative voltage onto the common discharge node following the discharge of the common discharge node to ground.

3. The apparatus of claim 2, wherein the negative boost circuitry comprises:
 a boost capacitor having a first terminal connected to an output of an inverter delay stage; and
 an input of the inverter delay stage controlled by a same control signal used to discharge the common discharge node.

4. The apparatus of claim 3, further comprising:
 a negative boost node coupled to a second terminal of the boost capacitor; and
 an isolation device configured to selectively couple the negative boost node to the common discharge node so as to prevent charge transfer from write data lines in unselected banks of the memory array to the negative boost node.

5. The apparatus of claim 4, wherein the isolation device is controlled by a same control signal used to control precharge devices associated with the write data lines.

6. The apparatus of claim 2, further comprising:
 a boost capacitor coupled to the common discharge node; and
 precharge circuitry coupled to the common discharge node, the write data lines and bit lines, wherein the precharge circuitry is configured to utilize charging energy of the boost capacitor in precharging the write data lines and bit lines.

7. The apparatus of claim 2, further comprising:
 a mimic bit line configured to have substantially the same discharge characteristics as the precharged write data lines and bit lines, wherein discharge of the mimic bit line is controlled by a same control signal used to discharge the common discharge node;
 trip voltage logic coupled to the mimic bit line, the trip voltage logic configured to generate a trip signal upon detection of the mimic bit line being discharged to ground potential; and
 the trip signal controlling a logic state of a feedback node common to discharge devices of the mimic bit line, and of the write data lines and the bit lines such that deactivation of the discharge of the common discharge node and application of the negative voltage onto the common discharge node does not occur until the bit lines and write data lines are discharged to ground.

8. The apparatus of claim 7, wherein the mimic bit line is associated with one or more dummy memory cells located at edge regions of the memory array.

9. An interlock apparatus for controlling timing of write assist circuitry associated with a memory array, comprising:
 a mimic bit line configured to have substantially the same discharge characteristics as write data lines and bit lines associated with the memory array;
 trip voltage logic coupled to the mimic bit line, the trip voltage logic configured to generate a trip signal upon detection of the mimic bit line being discharged to ground potential; and
 the trip signal controlling a logic state of a feedback node common to discharge devices of the mimic bit line, and of the write data lines and the bit lines of the memory array such that deactivation of the discharge of the selected write data lines and bit lines of the memory array during a write operation and application of a negative boost voltage to the selected write data lines and bit lines of the memory array does not occur until after the bit lines and write data lines are discharged to ground.

10. The interlock apparatus of claim 9, wherein discharge of the mimic bit line is controlled by a same control signal used to discharge the selected write data lines and bit lines of the memory array.

11. The interlock apparatus of claim 10, further comprising a margin adjust device configured to tune the discharge characteristics of the mimic bit line.

12. The interlock apparatus of claim 9, wherein the mimic bit line is associated with one or more dummy memory cells located at edge regions of the memory array.

13. A method for implementing a write assist for a memory array, the method comprising:
- configuring a common discharge node to provide a discharge path for precharged write data lines and bit lines selected during a write operation of the memory array;
- configuring negative boost circuitry to introduce a voltage lower than a nominal logic low supply voltage onto the common discharge node following the discharge of the common discharge node, write data lines and bit lines; and
- coupling a clamping device to the common discharge node, the clamping device configured to limit the magnitude of negative voltage applied to common discharge node by the negative boost circuitry so as to prevent activation of non-selected bit switches.

14. The method of claim 13, wherein the nominal logic low supply value is ground and the negative boost circuitry configured to introduce a negative voltage onto the common discharge node following the discharge of the common discharge node to ground.

15. The method of claim 14, wherein the negative boost circuitry comprises:
- a boost capacitor having a first terminal connected to an output of an inverter delay stage; and
- an input of the inverter delay stage controlled by a same control signal used to discharge the common discharge node.

16. The method of claim 15, further comprising:
- coupling a negative boost node to a second terminal of the boost capacitor; and
- configuring an isolation device to selectively couple the negative boost node to the common discharge node so as to prevent charge transfer from write data lines in unselected banks of the memory array to the negative boost node.

17. The method of claim 16, wherein the isolation device is controlled by a same control signal used to control precharge devices associated with the write data lines.

18. The method of claim 14, further comprising:
- coupling a boost capacitor to the common discharge node; and
- coupling precharge circuitry to the common discharge node, the write data lines and bit lines, wherein the precharge circuitry is configured to utilize charging energy of the boost capacitor in precharging the write data lines and bit lines.

19. The method of claim 14, further comprising:
- configuring a mimic bit line to have substantially the same discharge characteristics as the precharged write data lines and bit lines, wherein discharge of the mimic bit line is controlled by a same control signal used to discharge the common discharge node;
- coupling trip voltage logic to the mimic bit line, the trip voltage logic configured to generate a trip signal upon detection of the mimic bit line being discharged to ground potential; and
- the trip signal controlling a logic state of a feedback node common to discharge devices of the mimic bit line, and of the write data lines and the bit lines such that deactivation of the discharge of the common discharge node and application of the negative voltage onto the common discharge node does not occur until the bit lines and write data lines are discharged to ground.

20. The method of claim 19, wherein the mimic bit line is associated with one or more dummy memory cells located at edge regions of the memory array.

* * * * *